(12) United States Patent
Simon

(10) Patent No.: US 8,614,108 B2
(45) Date of Patent: Dec. 24, 2013

(54) ELECTRONIC DEVICE HAVING THERMALLY MANAGED ELECTRON PATH AND METHOD OF THERMAL MANAGEMENT OF VERY COLD ELECTRONS

(71) Applicant: Alcatel-Lucent USA Inc., Murray Hill, NJ (US)

(72) Inventor: Steven H. Simon, Oxford (GB)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/738,568

(22) Filed: Jan. 10, 2013

(65) Prior Publication Data

US 2013/0123111 A1    May 16, 2013

Related U.S. Application Data

(62) Division of application No. 12/269,851, filed on Nov. 12, 2008, now Pat. No. 8,421,072.

(51) Int. Cl.
*H01L 21/66* (2006.01)
*H01L 23/58* (2006.01)

(52) U.S. Cl.
USPC .............................................. 438/17; 257/48

(58) Field of Classification Search
USPC ............... 257/48, E21.521–E21.531; 438/10, 438/17–18
See application file for complete search history.

(56) References Cited

U.S. PATENT DOCUMENTS

| | | | |
|---|---|---|---|
| 8,421,072 B2 * | 4/2013 | Simon | 257/48 |
| 2007/0006583 A1 | 1/2007 | Venerusa | |
| 2008/0065225 A1 | 3/2008 | Wasielewski et al. | |
| 2009/0085688 A1 | 4/2009 | Yamamoto et al. | |
| 2010/0152057 A1 | 6/2010 | Lieber et al. | |

* cited by examiner

*Primary Examiner* — Calvin Lee
(74) *Attorney, Agent, or Firm* — Hitt Gaines, PC

(57) ABSTRACT

A device and a method of thermal management. In one embodiment, the device includes an integrated circuit, including: (1) a conductive region configured to be connected to a voltage source, (2) a transistor having a semiconductor channel with a controllable conductivity and (3) first and second conducting leads connecting to respective first and second ends of said channel, wherein a charge in the conductive region is configured to substantially raise an electrical potential energy of conduction charge carriers in the semiconductor channel and portions of said leads are located where an electric field produced by said charge is substantially weaker than near the semiconductor channel.

9 Claims, 4 Drawing Sheets

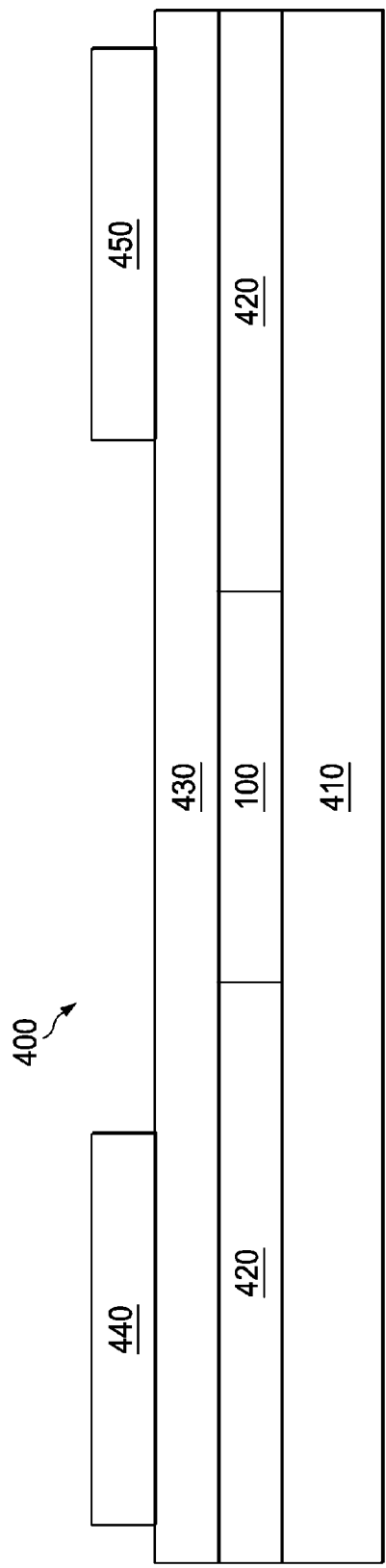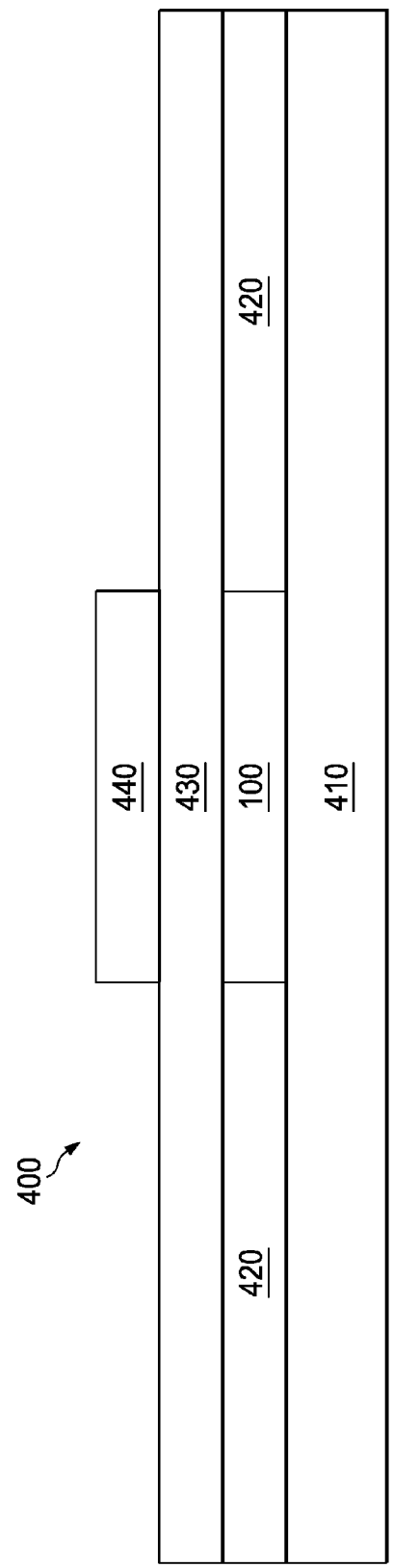

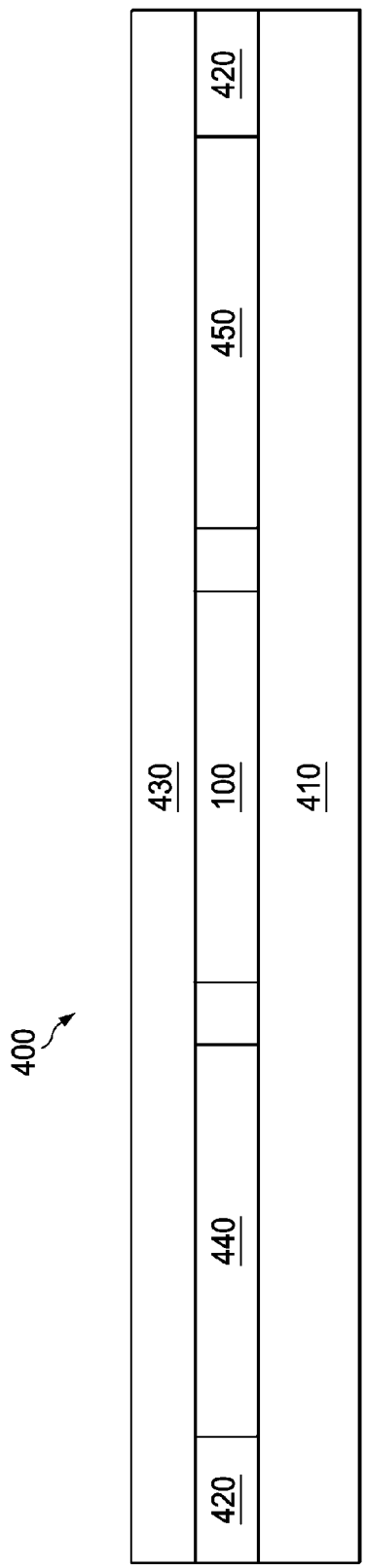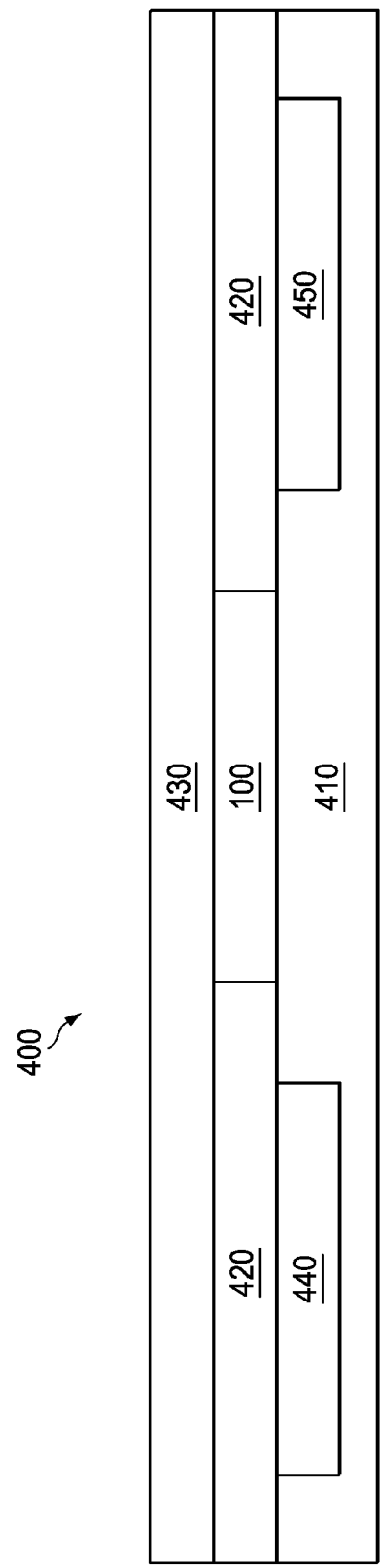

ELECTRONIC DEVICE HAVING THERMALLY MANAGED ELECTRON PATH AND METHOD OF THERMAL MANAGEMENT OF VERY COLD ELECTRONS

CROSS REFERENCE RELATED APPLICATION

This is a Divisional application of U.S. patent application Ser. No. 12/269,851 filed on Nov. 12, 2008 now U.S. Pat. No. 8,421,072 issued Apr. 16, 2013 to Steven Simon, entitled "ELECTRONIC DEVICE HAVING THERMALLY MANAGED ELECTRON PATH AND METHOD OF THERMAL MANAGEMENT OF VERY COLD ELECTRONS," which is incorporated herein by reference in its entirety.

TECHNICAL FIELD OF THE INVENTION

The invention is directed, in general, to thermal management and, more specifically, to an electronic device having a thermally managed electron path and method of thermal management of very cold electrons.

BACKGROUND OF THE INVENTION

Removing the heat electronic devices generate during operation has always been a concern. Addressing thermal management requires an understanding of the physics of heat generation and transfer (i.e., conduction, convection and radiation). Thermal management of devices operating well above absolute zero (e.g., 150° K and above) has long been understood. As a result, effective active and passive cooling techniques exist for such devices.

However, many near-future applications for devices, such as quantum computers, will require devices that operate very close to (e.g., within a few degrees Kelvin and perhaps small fractions of a degree of) absolute zero. Unfortunately, thermal management at such very low temperatures has proven quite complex and difficult. At very low temperatures, electrons become decoupled from the environment (a lattice of phonons) in which they travel as they flow through a material.

Two conventional thermal management techniques for very low temperatures exist. The first technique involves cooling the electrons before they go into the device. This is typically done by causing the electrons to pass through a large amount of very cold, porous metal. The large surface area of the metal keeps it cool. Unfortunately, this technique is problematic in that once the electrons enter the device, heat thereafter generated cannot be removed from them. U.S. Patent Application Publication No. 2007/0006583, filed by Veneruso on Jan. 11, 2007, entitled "Nanotube Electron Emission Thermal Energy Transfer Devices," describes a related technique in which cold nanotubes are used to cool the electrons before they enter the device.

The second technique involves cooling the lattice of phonons as much as possible, with the hope that the electrons will couple enough to get cool. Unfortunately, electrons begin to decouple significantly from phonons at around 50 mK, at which point lattice cooling begins to be ineffective. Lattice cooling utterly fails below 10 mK.

SUMMARY OF THE INVENTION

One aspect of the invention provides an apparatus. In one embodiment, the apparatus includes an integrated circuit (IC), including: (1) a conductive region configured to be connected to a voltage source, (2) a transistor having a semiconductor channel with a controllable conductivity and (3) first and second conducting leads connecting to respective first and second ends of said channel, wherein a charge in the conductive region is configured to substantially raise an electrical potential energy of conduction charge carriers in the semiconductor channel and portions of said leads are located where an electric field produced by said charge is substantially weaker than near the semiconductor channel.

Another aspect of the invention provides a method of operating an electronic device. In one embodiment, the method includes moving a charge to a conductive region to substantially increase a potential energy of conduction charge carriers in a controllable semiconductor channel of a transistor, the channel being located near the conductive region, the moving causing a density of the conduction charge carriers to be substantially lowered in the channel with respect to the density of said carriers therein in the absence of said charge being moved to the conductive region.

BRIEF DESCRIPTION OF THE DRAWINGS

For a more complete understanding of the invention, reference is now made to the following descriptions taken in conjunction with the accompanying drawings, in which:

FIGS. 4A-D are elevational views of one embodiment of an IC having various embodiments of thermally managed electron paths constructed according to the principles of the invention.

DETAILED DESCRIPTION

Disclosed herein are various embodiments of a novel technique for cooling an electronic device. Underlying the embodiments is the novel realization that an electronic device can be cooled by cooling the electrons provided to it by means of thermodynamic expansion. As a general rule, the temperatures of particles can usually be lowered by increasing the separation between the particles, in other words, decompressing them. An ideal particle follows the adiabatic law: (electrochemical potential-electrostatic potential)/T=constant. Thus by increasing the electrostatic potential, the density reduces, and the temperature drops. This holds true for electrons as well.

One way to decompress electrons is to cause them to flow up a potential hill. The electrons at the top of the potential hill are less dense; as the electrons go up the potential hill, they become cooler. While they will heat up again as they return down the potential hill, certain embodiments separate that return from the device, such that the return does not substantially heat the device. By establishing one or more potential hills proximate devices, heat can be managed, devices can be selectively cooled as desired, and critical devices and junctions in a circuit can be thermally managed.

In some embodiments, the novel technique is used in conjunction with one or more conventional cooling techniques, such as cooling the electrons by passing them through a porous material, cooling the lattice of the device itself, or other known active or passive cooling techniques. In those embodiments, the novel technique enhances cooling and further decreases electron temperatures.

Figure 1A:
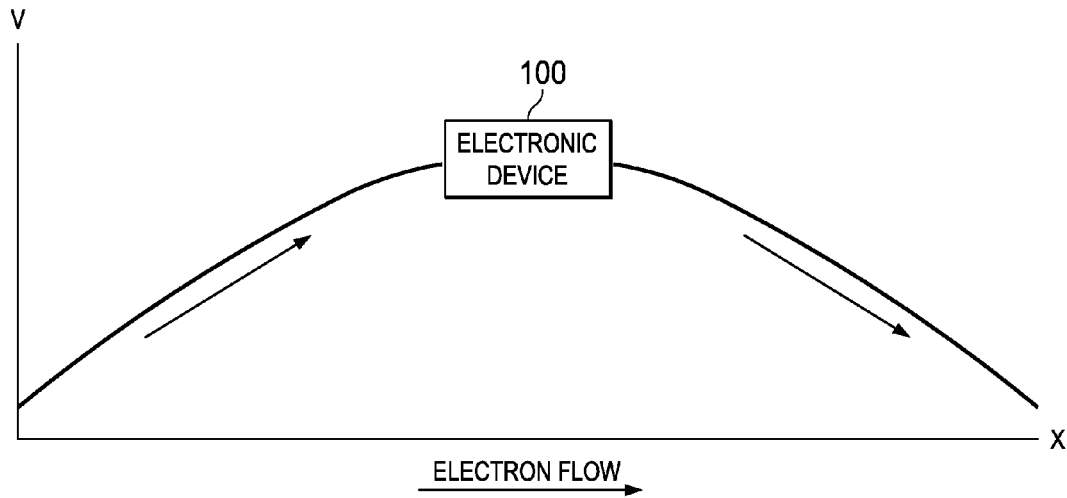
FIGS. 1A and 1B are respective graphs of electrostatic potential and charge carrier density as a function of length.
Figure 1B:
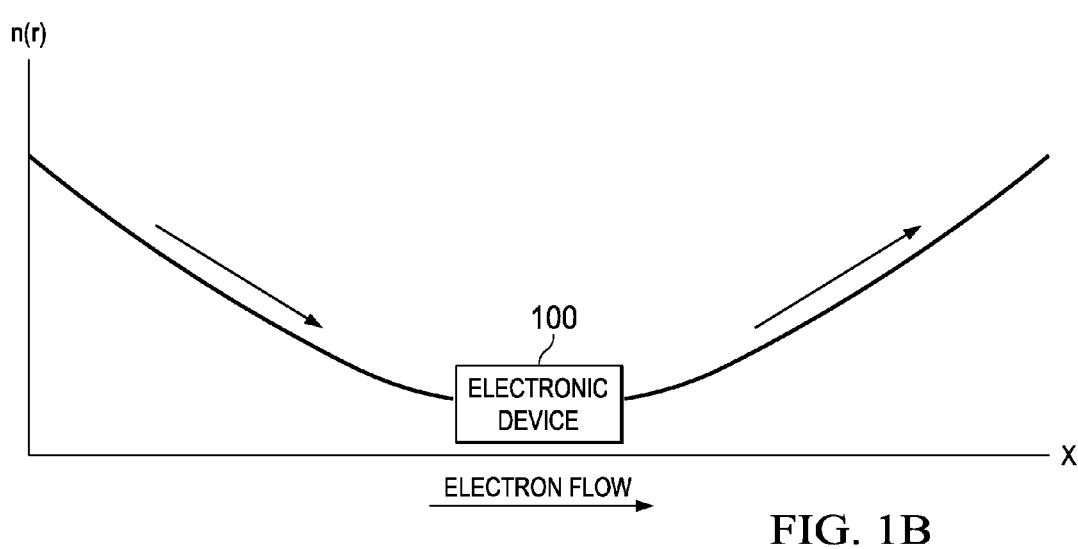

FIGS. 1A and 1B are respective graphs of electrostatic potential V and charge carrier density n(r) as a function of length x. FIG. 1A shows that, with the benefit of the novel technique, electrostatic potential rises as electrons flow along a path toward a device 100. In some embodiments, the electrostatic potential falls as the electrons flow away from the device 100. FIG. 1A is conceptual in that the curve representing electrostatic potential is not meant to indicate absolute values, rates of rise or fall or lengths over which the rising or falling takes place. It merely indicates that the electrostatic potential of electrons flowing toward the device 100 is higher for those electrons proximate the device 100 relative to those electrons farther away from the device 100.

FIG. 1B shows that, with the benefit of the novel technique, charge carrier density falls as electrons flow along the path toward the device 100. In some embodiments, the charge carrier density rises as the electrons flow away from the device 100. Like FIG. 1A, FIG. 1B is conceptual in that the curve representing charge carrier density is not meant to indicate absolute values, rates of fall or rise, lengths over which the falling or rising takes place or any function between electrostatic potential and charge carrier density. It merely indicates that the charge carrier density of electrons flowing toward the device 100 is lower for those electrons proximate the device 100 relative to those electrons farther away from the device 100.

Figure 2:
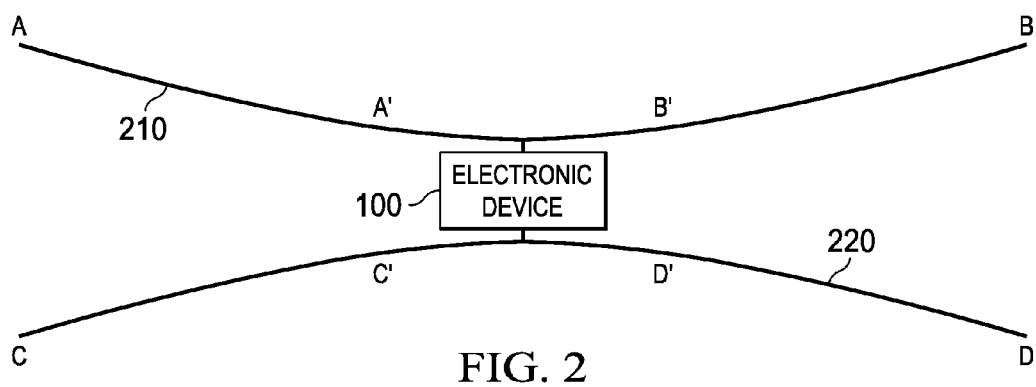
FIG. 2 schematically illustrates an electronic device having one embodiment of a thermally managed electron path constructed according to the principles of the invention.

FIG. 2 schematically illustrates an electronic device having one embodiment of a thermally managed electron path constructed according to the principles of the invention. In FIG. 2, two wires 210, 220 are tunnel-coupled to an electronic device 100. In the illustrated embodiment, the electronic device 100 is a quantum dot, e.g., a single-electron transistor (SET). The wires 210, 220 are assumed to be made of relatively high mobility material. Points A, B, C, D at ends of the wires 210, 220 are assumed to be at lattice temperature. The electrostatic potential in the wires 210, 220 goes up a potential hill to a higher electrostatic potential in the region between points A', B', C', D' so that electrons in this region are less dense than they are at the points A, B, C, D. Current continually flows along the wire 210 from the point A to the point B and along the wire 220 from the point C to the point D such that electrons are continually cooling as they go up the potential hills and heating as they come back down the potential hills. The cooler electrons couple to the electronic device 100. Thus, the temperature of the electronic device 100 comes to equilibrium with the cool electrons, and the temperature of the electronic device 100 is at a lower temperature than the wires 210, 220.

In one embodiment, the Fermi energy $E_f$ is not significantly higher than the temperature of the electronic device 100. In one embodiment, a cooling system (not shown) is employed to cool the electronic device 100 to below 150° Kelvin without using cryogenic liquids. In a more specific embodiment, the electrostatic potential is such that the absolute temperature of the electrons in the electronic device 100 is reduced by at least 10%. In another more specific embodiment, the electrostatic potential is such that the absolute temperature of the electrons in the electronic device 100 is reduced by at least 20 percent.

In another embodiment, the cooling system is employed to cool the electronic device 100 to below 0.5° Kelvin. In a more specific embodiment, the electrostatic potential is such that the absolute temperature of the electrons in the electronic device 100 is reduced by at least 5%.

In yet another embodiment, the cooling system is employed to cool the electronic device 100 to below 0.3° Kelvin. In a more specific embodiment, the electrostatic potential is such that the absolute temperature of the electrons in the electronic device 100 is reduced by at least 5%.

If the electronic device 100 is to act as an ultra-sensitive charge detection device, a voltage difference between points A and D would be measured, which voltage is sensitive to the precise value of the electrostatic potential at the electronic device 100. Thus, the electronic device 100 needs to be substantially isolated from thermal noise. Since isolation increases as temperature decreases, it is advantageous to cool the electronic device 100 to as low a temperature as possible. The novel technique described herein may be used alone or in conjunction with other conventional cooling techniques to achieve a very low operating temperature for the electronic device 100.

Figure 3:
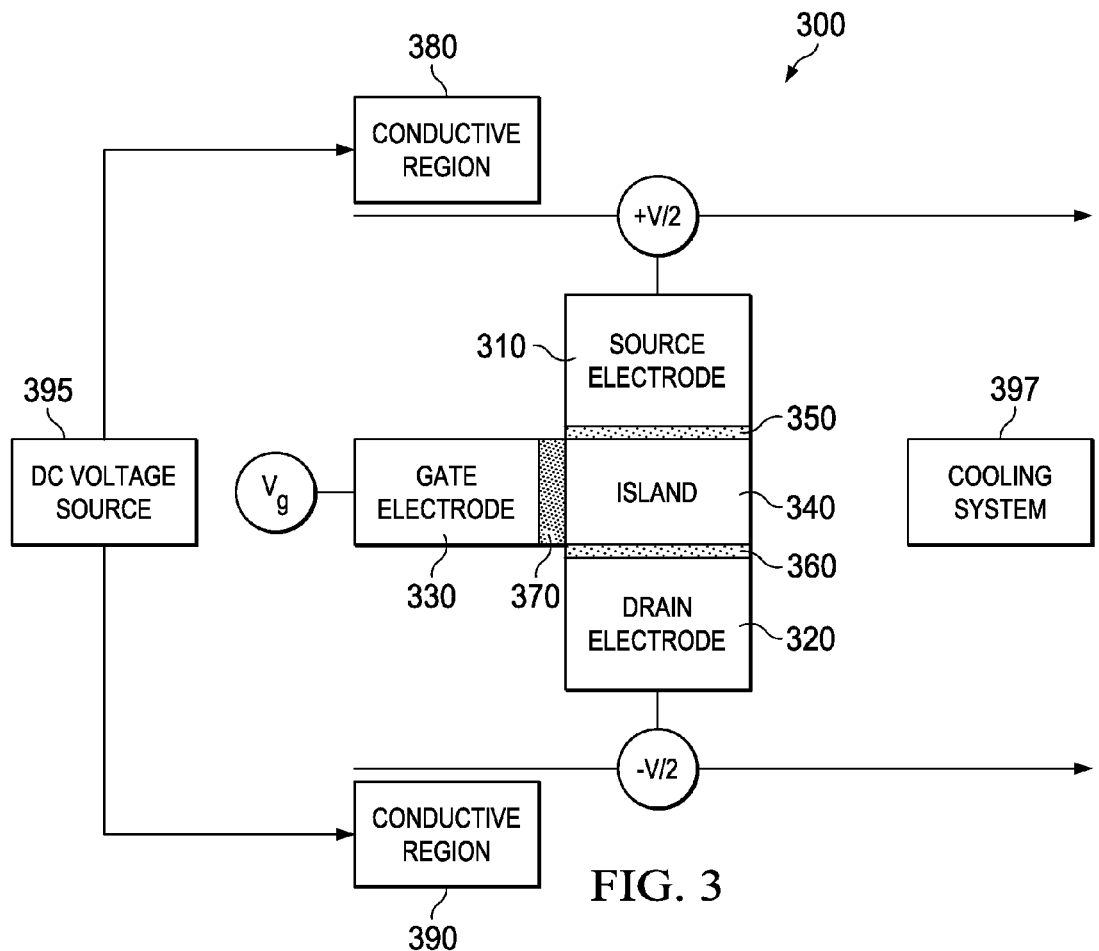
FIG. 3 is a diagram of one embodiment of a single-electron transistor having thermally managed electron paths constructed according to the principles of the invention.

FIG. 3 is a diagram of one embodiment of a SET 300 having thermally managed electron paths constructed according to the principles of the invention. A SET 300 may desirably be cooled below lattice temperatures in order to have ultra-high sensitivity (e.g., isolation from thermal noise).

As those skilled in the pertinent art are aware, the SET 300 is type of switching device that uses controlled electron tunneling to amplify current. Like a metal-oxide semiconductor field-effect transistor (MOSFET), the SET 300 has a source electrode 310, a drain electrode 320 and a gate electrode 330. The gate electrode 330 electrostatically influences electrons traveling between the source and drain electrodes 310, 320. However, the electrons in the SET 300 need to cross two tunnel junctions 350, 360 that form an isolated conducting (e.g., metallic) electrode called an island 340. In the illustrated embodiment, the SET 300 is a quantum dot; each tunnel junction 350, 360 is formed of a very thin (~1 nm) semiconductor layer and a metal layer. In an alternative embodiment, each tunnel junction 350, 360 is formed of an oxide and a metal layer.

The only way for electrons in one of the metal electrodes to travel to the other electrode is to tunnel through the insulator. Electrons passing through the island 340 charge and discharge it, and the voltage applied to the gate electrode 330, applied across an isolation barrier, affects the amount of energy needed to change the number of electrons on the island between 0 and 1. Since tunneling is a discrete process, the electric charge that flows through the tunnel junction flows in multiples of the charge of a single electron, e. At a low source-drain voltage, a current only flows through the SET 300 if the charge configurations of the source and drain electrodes 310, 320 have the same energy. Accordingly, FIG. 3 shows a positive voltage +V/2 applied to the source electrode 310, a negative voltage −V/2 applied to the drain electrode 320 and a local ground voltage $V_g$ applied to the gate electrode 330.

FIG. 3 illustrates conductive regions 380, 390 associated with leads (e.g., conductors) that provide the positive and negative voltages +V/2, −V/2. The conductive regions 380, 390 are configured to substantially raise an electrical potential energy of conduction charge carriers in the path that passes through the tunnel junction 350, across the island 340 and through the tunnel junction 360, which together constitute the semiconductor channel of the SET 300. Portions of the leads are located where an electric field produced by a charge existing in the conductive regions 380, 390 is substantially weaker than near the semiconductor channel. In an alternative embodiment, only the conductive region 380 is associated with the SET 300; the lead associated with the drain electrode 320 has no conductive region. In another alternative embodiment, only the conductive region 390 is associated with the SET 300; the lead associated with the source electrode 310 has no conductive region.

In the embodiment of FIG. 3, a DC voltage source 395 is connected to the conductive regions 380, 390 with a polarity that raises the electrical potential energy of the conduction charge carriers in the semiconductor channel with respect to the electrical potential energy of said conduction charge carriers therein in an absence of the DC voltage source 395.

In one embodiment, a cooling system 397 is employed to cool the SET 300 to below 150° Kelvin without using cryogenic liquids. In a more specific embodiment, the electrostatic potential is such that the absolute temperature of the electrons in the SET 300 is reduced by at least 10%. In another more specific embodiment, the electrostatic potential is such that the absolute temperature of the electrons in the semiconductor channel of the SET 300 is reduced by at least 20 percent.

In another embodiment, the cooling system 397 is employed to cool the SET 300 to below 0.5° Kelvin. In a more specific embodiment, the electrostatic potential is such that the absolute temperature of the electrons in the semiconductor channel of the SET 300 is reduced by at least 5%.

In yet another embodiment, the cooling system 397 is employed to cool the SET 300 to below 0.3° Kelvin. In a more specific embodiment, the electrostatic potential is such that the absolute temperature of the electrons in the semiconductor channel of the SET 300 is reduced by at least 5%.

FIGS. 4A-D are elevational views of one embodiment of a monolithic IC 400 having various embodiments of thermally managed electron paths constructed according to the principles of the invention. In FIG. 4A, the IC 400 has a monolithic substrate 410. One or more device layers 420 are located in or on (the two terms being regarded as synonymous for purposes of this discussion) the monolithic substrate 410. The electronic device 100 is located in the one or more device layers 420. An interconnect layer 430 overlies the one or more device layers 420. Paths to and from the electronic device 100 may lie in the one or more device layers 420, the interconnect layer 430, or both. One or more conductive regions 440, 450 overlie the interconnect layer 430. In the embodiment of FIG. 4A, the one or more conductive regions 440, 450 include a conductor that is configured to establish an electromagnetic field about one or both of the paths. Thus, the conductor acts as a capacitor plate. In FIG. 4A, the one or more conductive regions 440, 450 are laterally offset from the electronic device 100 to allow access thereto from above as may be desired.

FIG. 4B illustrates an alternative embodiment in which only one conductive region 440 is provided. As in FIG. 4A, the conductive region 440 is configured to establish an electromagnetic field about one or both of the paths and acts as a capacitor plate.

FIG. 4C illustrates another alternative embodiment in which the one or more conductive regions 440, 450 are located in the one or more device layers 420. Thus, the one or more conductive regions 440, 450 need not overlie the one or more device layers 420; they may be located in the same layer or layers. In the embodiment of FIG. 4C, the one or more conductive regions 440, 450 take the form of one or more regions in the one or more device layers 420 that are more heavily doped than the region that includes the electronic device 100. Electrons moving from the more heavily doped regions to the electronic device 100 lose heat as they become less dense.

FIG. 4D illustrates yet another alternative embodiment in which the one or more conductive regions 440, 450 are located in the monolithic substrate 410. Thus, the one or more conductive regions 440, 450 may underlie the one or more device layers 420. In still another alternative embodiment, only one conductive region 440 is provided, which directly underlies the electronic device 100. In the embodiment of FIG. 4C, the one or more conductive regions 440, 450 take the form of one or more doped regions in the monolithic substrate 410.

It has been found that ohmic heating caused by the flow of the electrons themselves may be reduced by employing high mobility materials for the lattice that constitutes the paths and the electronic device 100. It has also been found that scattering with the lattice tends to bring electrons back to the ambient lattice temperature. Therefore, the novel technique works best in a regime where the electron-electron scattering length is short relative to the elastic scattering length, which is long for high mobility materials.

Figure 5:
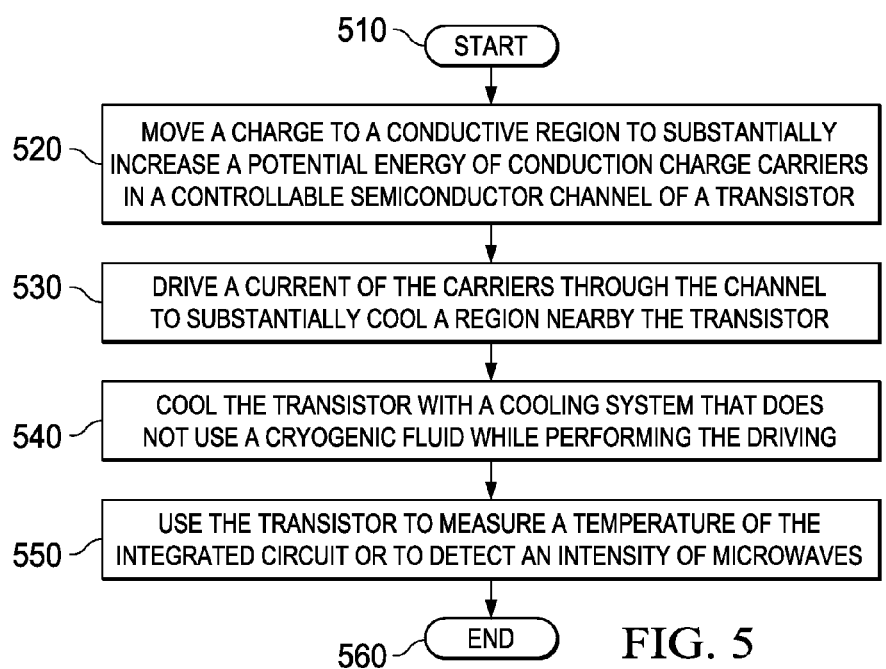
FIG. 5 is a flow diagram of one embodiment of a method of managing electron heat carried out according to the principles of the invention.

FIG. 5 is a flow diagram of one embodiment of a method of managing electron heat carried out according to the principles of the invention. The method begins in a start step 510. In a step 520, a charge is moved to a conductive region to substantially increase a potential energy of conduction charge carriers in a controllable semiconductor channel of a transistor. In a step 530, a current of the carriers is driven through the channel to substantially cool a region nearby the transistor. In a step 540, the transistor is cooled with a cooling system (e.g., the cooling system 397 of FIG. 3) that does not use a cryogenic fluid while performing the driving. In a step 550, the transistor is used to measure a temperature of the IC or to detect an intensity of microwaves. The method ends in a step 560.

Those skilled in the art to which the invention relates will appreciate that other and further additions, deletions, substitutions and modifications may be made to the described embodiments without departing from the scope of the invention.

What is claimed is:

1. A method, comprising:
   operating an electronic device, including:
   storing a charge in a conductive region to substantially raise a potential energy of conduction charge carriers in a semiconductor channel of a transistor, the channel being located near the conductive region, the stored charge causing a density of the conduction charge carriers to be substantially lowered in the channel with respect to the density of said carriers therein in the absence of said stored charge,
   wherein the channel includes a first tunnel junction capable of passing the conduction charge carriers from a first conducting lead to a quantum island and a second tunnel junction capable of passing the conduction charge carriers from the quantum island to a second conducting lead.

2. The method of claim 1, further comprising using the electronic device to measure a temperature or to detect an intensity of microwaves.

3. The method of claim 1, wherein the semiconductor channel and conductive region are located in an integrated circuit of the electronic device.

4. The method of claim 1, further including driving a current of said carriers through said channel to substantially cool a region nearby said transistor.

5. The method of claim 1, further comprising cooling said transistor to below 150° Kelvin with a cooling system that does not use a cryogenic fluid while driving said current.

6. The method of claim 5, further comprising cooling said transistor with said cooling system to a temperature of less than 0.3° Kelvin while driving said current.

7. The method of claim 5, wherein said driven current further reduces an absolute temperature of a region nearby the transistor by at least 10 percent with respect to a lowest temperature to which the cooling system can cool the region nearby the transistor in the absence of the current.

8. The method of claim 5, wherein said driven current further cools a region nearby the transistor to an absolute temperature at least 5 percent lower than a temperature produced by the cooling the transistor with the cooling system.

9. The method of claim 5, wherein said driven current cools conduction charge carriers in the semiconductor channel to a temperature substantially lower than a temperature of a lattice of the semiconductor of the channel.

\* \* \* \* \*